May 3, 1966 A. J. CASTELLANO, JR 3,249,893
VOLTAGE CONTROLLED MULTIVIBRATOR WITH INCREASED
FREQUENCY DEVIATION
Filed Feb. 20, 1963 4 Sheets-Sheet 1

INVENTOR.
ANTHONY J. CASTELLANO, JR.
BY Kenyon & Kenyon
ATTORNEYS

INVENTOR.
ANTHONY J. CASTELLANO, JR.
BY
Kenyon & Kenyon
ATTORNEYS

INVENTOR.
ANTHONY J. CASTELLANO, JR.

BY
Kenyon & Kenyon
ATTORNEYS

INVENTOR.
ANTHONY J. CASTELLANO, JR.
BY Kenyon & Kenyon
ATTORNEYS

1

3,249,893

VOLTAGE CONTROLLED MULTIVIBRATOR WITH INCREASED FREQUENCY DEVIATION

Anthony J. Castellano, Jr., New Fairfield, Conn., assignor to Data-Control Systems, Inc., Danbury, Conn., a corporation of Delaware Filed Feb. 20, 1963, Ser. No. 259,869
4 Claims. (Cl. 331—113)

This invention relates in general to voltage controlled oscillators and more particularly to a means for broadening the frequency deviation available from a voltage controlled oscillator. The voltage controlled oscillator incorporating the means of this invention for widening its frequency deviation has particular applicability in a phase locked loop.

A phase locked loop which is typically used to demodulate an input information signal has certain band width limitations. The band width limitations arise out of frequency deviation limitations within the voltage controlled oscillator. If the voltage controlled oscillator is driven too far beyond its frequency limitations, it will cease to operate properly. The phase locked loop in which it is incorporated may lose lock. The voltage controlled oscillator may provide an inadequate signal to obtain an appropriate output from the phase comparator. In short, there is a limitation to the frequency deviation around band center frequency which may achieved. This limitation leads to a band width limitation on the phase locked loop when operating as a demodulator and thus a limitation on the information that may be usefully carried on the input signal.

To properly understand these limitations and the way in which this invention overcomes the limitations, it is necessary to have a somewhat detailed understanding of the operation of the voltage controlled oscillator and of the phase locked loop within which such an oscillator may be used.

It is a broad object of this invention, therefore, to provide a means for increasing the frequency deviation available from a voltage controlled oscillator.

It is a more specific object of the invention to provide such a means for increasing oscillator deviation which will be adapted for incorporation in a phase locked loop.

It is thus a related object of this invention to increase the band width of a phase locked loop when used as a demodulator.

In brief, this invention involves the addition of a current source (herein called a secondary current source) to a prior art type of voltage controlled oscillator. By phasing this secondary current to oppose the main current in the timing capacitor the frequency deviation available is increased for reasons that will be adduced in the more detailed description. As will also be explained later, this particular technique of increasing the frequency deviation of a voltage controlled oscillator has particular value in a phase locked loop. However, to even briefly comprehend the operation of this invention one must understand the operation of the voltage controlled oscillator.

The voltage controlled oscillator is one in which a capacitor operates as a partial control over the output frequency. Voltage controlled switches and a main current source are connected to the capacitor. The operation of the voltage controlled oscillator requires the build up of a voltage on the capacitor by pumping current from the main current source into one side of the capacitor until a pre-determined voltage has been achieved. At that pre-determined voltage one of the voltage controlled switches is turned from its off state to its on state and a pulse of current is thereby transmitted to the output of the voltage controlled oscillator through the switch that has just been turned on.

2

A comparable pre-determined voltage is then built up on the other side of the capacitor by pumping current from the main current source into the other side of the capacitor until that capacitor reaches the pre-determined voltage. The pre-determined voltage causes a second switch to turn on thereby transmitting a pulse of current through that second switch to the output of the voltage controlled oscillator. When one of the two switches is turned on, the other switch is automatically turned off so that this process can be repeated.

The output frequency is determined by the rate at which the voltage on the capacitor builds up to the pre-determined voltage. Once a given capacitor has been selected for a design, the rate at which the pre-determined voltage is developed depends upon the magnitude of the current pumped into either side of the capacitor. The magnitude of the current being pumped into the capacitor is determined by the current put out by the main current source. The magnitude of the current put out by the main current source is made responsive to the voltage magnitude of an input signal so that the actual frequency put out by the voltage controlled oscillator is controlled by an input voltage. When there is a zero voltage input, the oscillator will put out what is called band center frequency and as the input voltage varies around zero, the output frequency will vary around the band center frequency.

In this invention a secondary current source is connected across the capacitor in such a fashion as to modify the net current flowing through the capacitor while leaving unaffected the magnitude of the current available from the main current source for transmission by the switches. In the preferred embodiment, the current from the secondary current source is phased to always oppose the direction of current from the main current source in the capacitor so that the net current flowing in the capacitor is reduced. The magnitude of the capacitor then, of course, has to be adjusted in order to maintain the same band center frequency. However, with the lower total current flowing through the capacitor, a given change in the magnitude of the current from the main current source (the magnitude of which current is controlled by the magnitude of input voltage to the oscillator) will result in a greater change in frequency from band center than would occur in the unmodified oscillator. In this fashion, this invention increases the frequency deviation available from a voltage controlled oscillator.

Other objects and purposes of the invention will become apparent from a consideration of the detailed description and of the drawings, in which:

FIG. 8 is a simplified schematic of one embodiment of the entire invention shown in block form in FIGS. 2 and 4.

Figure 1:
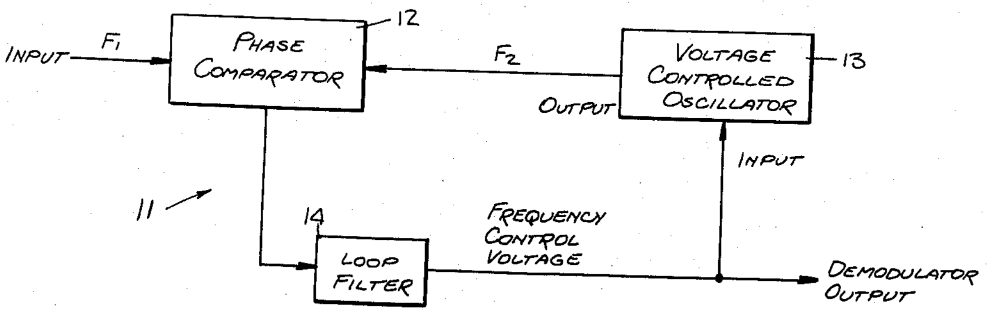
FIG. 1. PRIOR ART
FIG. 1 is a block diagram of the phase locked loop into which this invention may be usefully incorporated.
Figure 2:
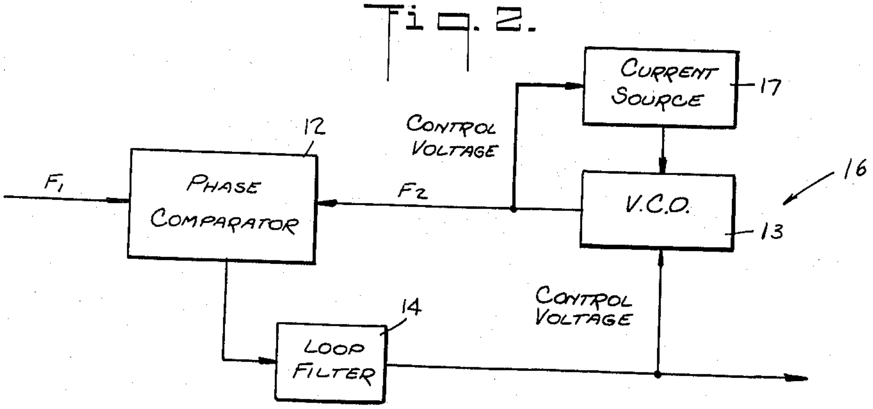
FIG. 2 is a block diagram of this invention in which a current source is tied into the voltage controlled oscillator block of the phase locked loop.

The invention in its simplest form can best be understood by reference to the block diagrams of FIGS. 1 and 2. FIG. 1 represents a prior art phase locked loop 11. The operation of this loop 11 is known to the art and need not be gone into in detail here. Briefly, the loop 11 is comprised of a phase comparator 12, a voltage controlled oscillator 13 (herein also denoted as a VCO 13) and a loop filter 14. The phase comparator 12 has two inputs, the first input $F_1$ being the input signal to the loop and the second input $F_2$ to the comparator 12 being the output signal from the voltage controlled oscillator 13. The comparator 12 will produce an output whose magnitude is a linear function of the phase difference between $F_1$ and $F_2$. The comparator output can be generically termed an error signal. This error signal is then fed through a loop filter 14 to control the output frequency of the voltage controlled oscillator 13.

The VCO 13 has a center frequency which will appear at its output $F_2$ when there is no input signal to the VCO 13. An input signal to the VCO 13 will cause the VCO 13 output frequency $F_2$ to shift around the center frequency. The magnitude of the deviation from the center frequency will be a function of the magnitude of the input signal and the direction of the deviation about the center frequency will be a function of the polarity of the input signal. Thus the loop 11 operates to create an error signal which will maintain the $F_2$ input to the phase comparator at the same frequency as the $F_1$ input to the phase comparator. The error signal itself must be of a magnitude adequate to maintain $F_2$ at a frequency equal to $F_1$ and this is achieved by the VCO 13 providing a signal $F_2$ which maintains a phase difference with $F_1$ adequate to obtain the appropriate error signal from the phase comparator 12.

The loop filter 14 is an equalizing network which is connected in the feed back path to determine the dynamic characteristics of the entire loop 11 and need not be considered for the purposes of the immediate discussion concerning the functioning of the loop 11. For reasons which will appear later, the loop filter 14 is related to the reason why the structure of this invention has particular value in widening the frequency deviation of the VCO 13 used in a phase locked loop 11.

It can readily be seen that this loop 11 can operate as a demodulator. If the center frequency of the VCO 13 output $F_2$ is made equal to the carrier frequency of a modulated input $F_1$, then the error signal output from the phase comparator 12 will be the demodulated output which may then be available as the output of the entire loop 11 as indicated in FIG. 1.

In its simplest terms, the heart of this invention can be indicated by reference to FIG. 2. FIG. 2 is also a phase locked loop 16 having all the elements of the prior art phase locked loop 11 and in addition a constant current source 17. The current source 17 supplies a secondary current whose magnitude is constant and predetermined (pre-determined at two milliamperes in the particular embodiment hereinafter described). However, the direction (or polarity) of the output from this current source 17 is switched at the same rate as the VCO 13 output frequency $F_2$.

To understand why it is that the current source 17 can operate to change the percentage frequency deviation in the VCO 13, it is necessary to understand the operation of the VCO 13 and to understand how the current source 17 is coupled up to the VCO 13. A more complete and detailed description to impart this understanding adequately will be undertaken in connection with FIGS. 3, 4 and 5.

*The VCO*

Figure 3:
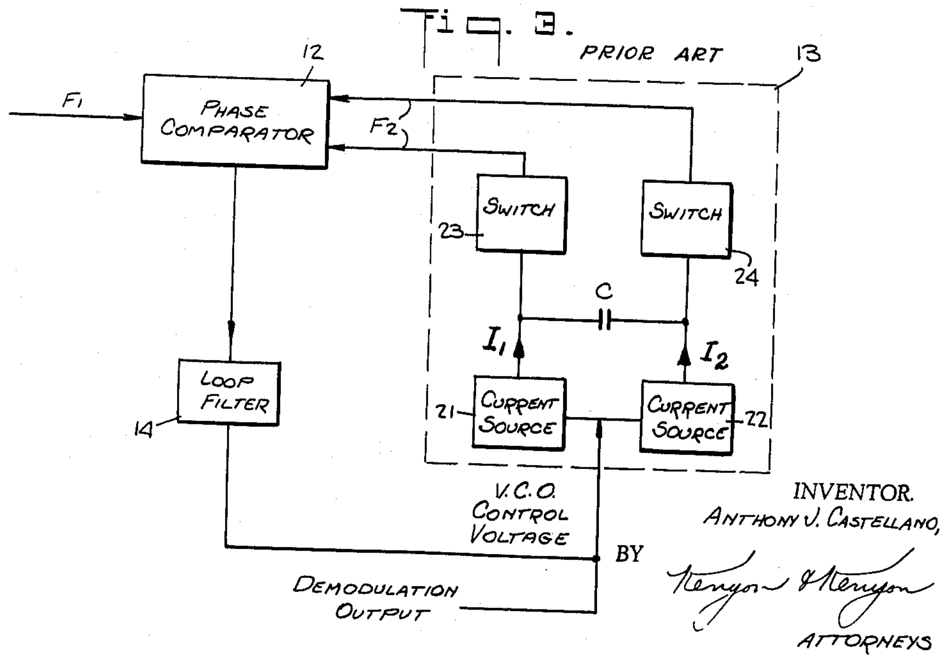
FIG. 3 is a more detailed block diagram of the phase locked loop of FIG. 1 in which there is shown the major components within the voltage controlled oscillator (VCO)

To properly understand this invention, it is necessary to understand the fundamental operation of the VCO 13. For this purpose, reference should be made to FIG. 3 in which the VCO 13 internal structure is displayed in simplified block form. For this purpose the VCO 13 can be considered as composed of two main current sources 21, 22, two voltage controlled switches 23, 24 and a timing capacitor C arranged as shown in FIG. 3. When the input to the VCO 13 is zero, the output $F_2$ from the VCO 13 is at its band center frequency. The current sources 21 and 22 are designed to provide equal current output so that $I_1=I_2$. (In one embodiment, and for the purposes of this explanation, the magnitude of the output of each current source 21, 22 is three milliamperes when the input signal is zero.)

The voltage controlled switches 23, 24 are arranged so that one of the two switches 23, 24 is on at all times but both switches cannot be on at the same time. In order to assure this type of switching arrangement, there must be interconnections between the two switches 23, 24 which are not shown in the simplified block diagram of FIG. 4.

Thus if switch 23 is on, switch 24 will be off and the current $I_1$ from the current source 21 will be passed by switch 23 to the phase comparator 12. At the same time, switch 24 will be off and will block the current $I_2$ so that the current $I_2$ will be fed to the timing capacitor C and will build up a charge on the capacitor C. The switch 24 is designed so that it will be switched to its on state when a pre-determined voltage is built up on the capacitor C. When the current $I_2$ builds the charge in the capacitor C up to this pre-determined voltage, the switch 24 will switch on, causing the switch 23 to switch off. Consequently the current $I_2$ will be passed to the phase comparator 12 and the current $I_1$ blocked from the VCO 13 output. The current $I_1$ will then proceed to build up a voltage on the other side of the timing capacitor C. The switch 23 is designed to be identical to the switch 24 and to be turned on at the same pre-determined voltage, which voltage is developed on the timing capacitor C. In this fashion, the switches 23, 24 are alternately turned on and off to provide a VCO 13 output $F_2$ which has a frequency that is determined by the magnitude of the currents put out by the current sources 21, 22, the value of the timing capacitor C and the predetermined build up voltage point at which the switches 23, 24 will be turned on. The input to the VCO 13 is connected to the current sources 21, 22 in such a fashion as to cause the magnitude of the output from the current sources 21, 22 to vary as the magnitude of the input signal varies. In the particular embodiment herein described, a positive input to the VCO 13 will cause a decrease in output frequency and a negative input to the VCO 13 will cause an increase in output frequency. The deviation of the output frequency $F_2$ from the band center frequency will be directly proportional to the magnitude of the input signal voltage.

*The modified VCO*

Figure 4:
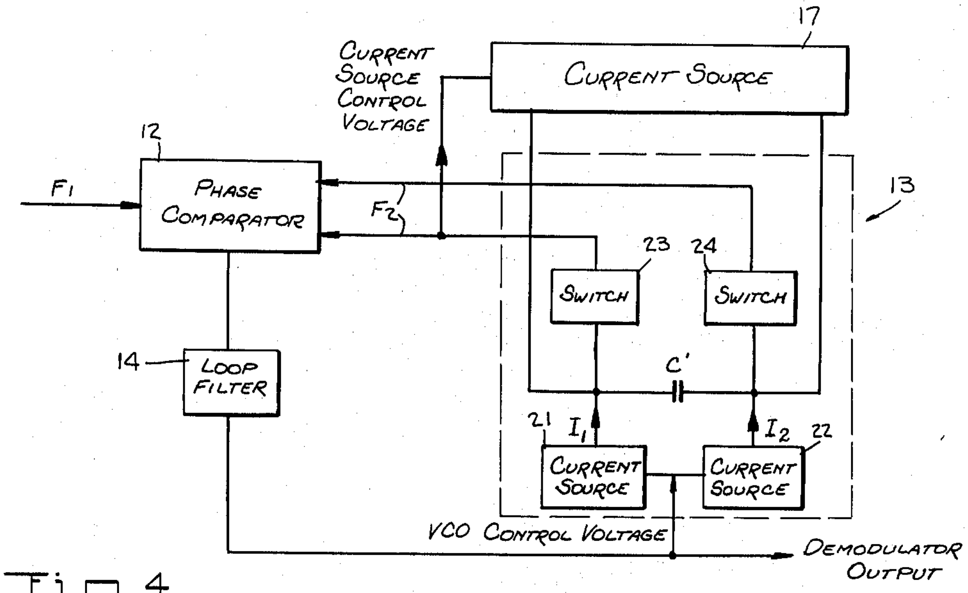
FIG. 4 is a block diagram showing the way in which this invention ties in an additional current source to the VCO portion of the phase locked loop.

With the above operation of the VCO 13 in mind, reference to FIG. 4 will indicate the operation of this invention. A constant current source 17 is provided which will supply a constant current output (in this embodiment two milliamperes). The current source 17 has two output leads, one of which is connected to one side of the timing capacitor C′ and the other of which is connected to the other side of the timing capacitor C′. A switching circuit is provided within the current source 17 that will channel the two milliamperes output along either one of these two leads but not both at the same time. The internal switching circuit is controlled by an input signal to the current source 17 which input control signal is picked off of an output from the switch 23 within the VCO 13.

The switching circuitry within the current source 17 is so arranged that the two milliampere output from the current source 17 is fed to the timing capacitor C′ in opposition to the current fed by the VCO 13 main current sources 21, 22. Thus when the switch 24 is closed and the current source 22 output $I_2$ is being fed into the capacitor C′ at its junction with the switch 24, the current source 17 will be providing a two milliampere current in opposition to the three milliamperes $I_2$ current.

This two milliampere current from the current source 17, accordingly, will be supplied into the timing capacitor C′ at its junction with the switch 23 and the current source 21 and will be pulled out of the timing capacitor C′ at its junction with the switch 24 and current source 22. Thus the current source 17 will supply a two milliampere current that will buck the three milliampere current supplied by the current source 22 to provide a net current of one milliampere to the timing capacitor.

Since the net current through the timing capacitor is one milliampere, it is necessary to decrease the capacitance of the timing capacitor C′ to ⅓ of its previous capacitance in order to maintain the same band center frequency. In connection with this last remark, it should be remembered that the switches 23 and 24 will still require the same voltage build up on the capacitor C′ before they will switch from the off to the on state. With the net current being fed to the capacitor C′ reduced to ⅓, it becomes necessary to reduce the capacitance to ⅓ in order to build up to that same voltage in the same time and thus to maintain the same band center frequency output from the VCO 13.

The prior art VCO 13 and the secondary current source 17 can be considered together as a modified VCO. This modified VCO (13 plus 17) will continue to have the output from its main current sources 21, 22 modified by an input signal (which is the demodulated signal). However, a given input signal will have three times as much effect on the percentage change in the one milliampere current to the capacitor $C_2$ as it has on the three milliampere current in the prior art. Since frequency deviation in percent equals capacitor C′ current change in percent, this particular reduction of net capacitor current increases frequency deviation obtainable by 300%. In one embodiment, the theoretical limit of frequency deviation was increased from about 27% to about 81%. In that embodiment, at a band center frequency of 700 kc. a frequency deviation of ±175 kc. was obtainable without the invention. With the invention added, a desired deviation of ±300 kc. was easily met.

*The secondary current source*

Figure 5:
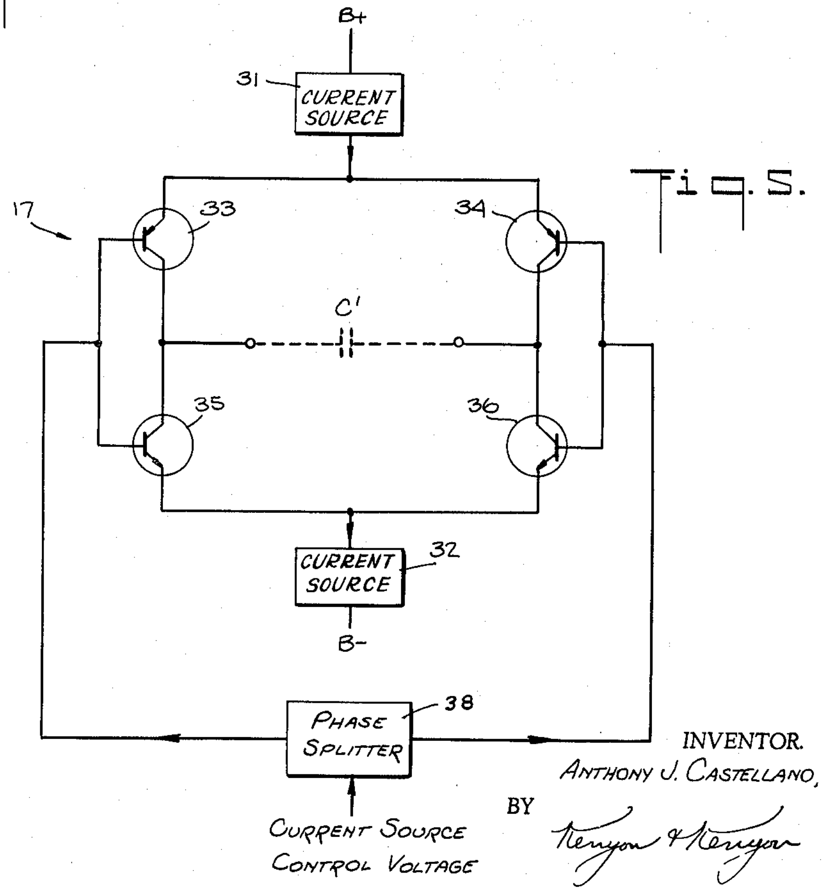
FIG. 5 is a detailed block diagram of the current source which this invention adds to the phase locked loop.

A simplified block schematic of the constant current source 17 and of its connections to the timing capacitor C′ is illustrated in FIG. 5. Two subsidiary constant current sources 31, 32 are arranged in series to supply a two milliampere current to the timing capacitor C′. However, four switches 33, 34, 35 and 36 are interposed between these subsidiary current sources 31, 32 and the timing capacitor C′ so as to direct the current from the current sources 31, 32 into the appropriate side of the timing capacitor at the appropriate time.

It is desired to have the milliampere current provided by the current source 17 fed to the timing capacitor C′ in opposition to the three milliampere current fed by the current sources 21, 22 in the VCO 13. Accordingly, it is necessary that the switches 33, 34, 35 and 36 be controlled by a signal which has the same frequency as the output of the VCO 13. This is simply achieved by conveniently selecting a point on the output of the switch 23 in the VCO 13 and feeding that into the two milliampere current source 17 as a timing input. The timing input is fed through a phase splitter 38 in order to provide two signals 180° out of phase with one another. The in-phase signal is fed to the switches 34 and 36 while the out-of-phase signal is fed to the switches 33 and 35. In addition, the switches 33, 34, 35 and 36 are so arranged that they will conduct current in one direction only (downwardly as shown in FIG. 5). Thus when switch 33 is turned on it will permit current from the current generator 31 to pass down to the left side of the timing capacitor C′. Similarly, when switch 35 is turned on it will permit current to be drawn from the left side of the timing capacitor C′ through the current generator 32. It should be noted that these current sources 31 and 32 will provide a current in one direction only, that direction being indicated in FIG. 6 by the appropriate arrows.

Because of the operation of the phase splitter 38 when there is a positive input to the switches 34 and 36 there will be a negative input to the switches 33 and 35. A positive input will tend to turn on the switch 36 and turn off the switch 34 while a negative input will tend to turn on the switch 33 and turn off the switch 35 so that the resulting current flow will be through the generator 31, the switch 33 into the left side of the capacitor C′, out of the right side of the capacitor C′, through the switch 36 and finally through the current source 32. The reverse will happen on the negative cycle of the input signal which will provide a negative signal on switches 34 and 36 and a positive signal on switches 33 and 35 thereby turning on switch 34 and turning off switch 36 while turning on switch 35 and turning off switch 33. This switching arrangement will switch state once for each half cycle of the output frequency $F_2$ of the VCO 13 and thus will track with the switching rate through the switches 23 and 24 within the VCO 13 to always provide a two milliampere current in opposition to the three milliampere current building up in the timing capacitor C′.

*The modified phase locked loop*

The invention, which is the incorporation of a secondary current source into a VCO to achieve a wider frequency deviation, has particular value in a phase locked loop. One of the major teachings of this invention is that the modified VCO (13 plus 17) can be incorporated into a phase locked loop 11 to achieve a broader loop frequency band without losing lock or otherwise malfunctioning. The reasons for the particular applicability of this invention to a phase locked loop are as follows.

The output of the phase comparator 12 is a square wave. When there is no error signal output, $F_1=F_2$ in frequency and are 90° out of phase thereby providing a 50% duty cycle square wave and thus a square wave having no D.C. component. Accordingly, the no error signal condition means a square wave with an average value of zero. Thus there is always an output from the phase comparator. However, all reference herein to a phase comparator 12 output, or loop filter 14 output, or VCO 13 input refers to the error signal alone unless, as in the immediate discussion, otherwise indicated. In certain claims the oscillator will be considered alone and in such case reference will be made to an input D.C. signal. It shall be understood that such reference is to a signal having a frequency less than the output frequency of the oscillator.

To return to the comparator 12, when there is a phase difference other than 90° between $F_1$ and $F_2$, the square wave will be modified so that the positive half cycles will cover either more or less than 180° and the result will be a duty cycle modulation of the phase comparator 12 output which thereby provides a D.C. average value that we call the error signal. (This D.C. component is D.C. relative to the square wave but itself may vary in magnitude and polarity depending entirely on the information signal being carried by $F_1$.)

In order to obtain necessary dynamic characteristics in the loop 11, a loop filter 14 is added which converts the square wave to a triangular wave. This triangular wave is fed to the input to the VCO 13 along with the error signal and because of the peak voltages on the triangular wave, it can cause the main current sources 21, 22 to fail to provide adequate current to keep the switches 23, 24 operating properly as switches. The reasons for this can best be explained by reference to FIG. 6, a schematic of a prior art VCO 13.

Figure 6:
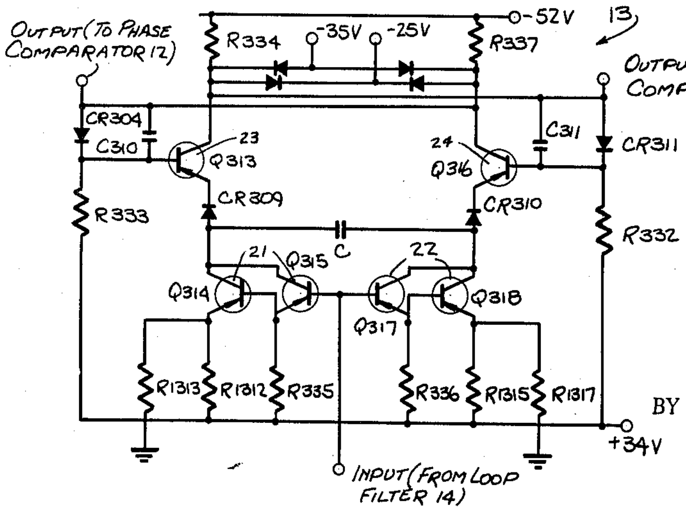
FIG. 6. PRIOR ART
FIG. 6 is a schematic diagram of the voltage controlled oscillator in the phase locked loop of FIG. 1.
Figure 4:
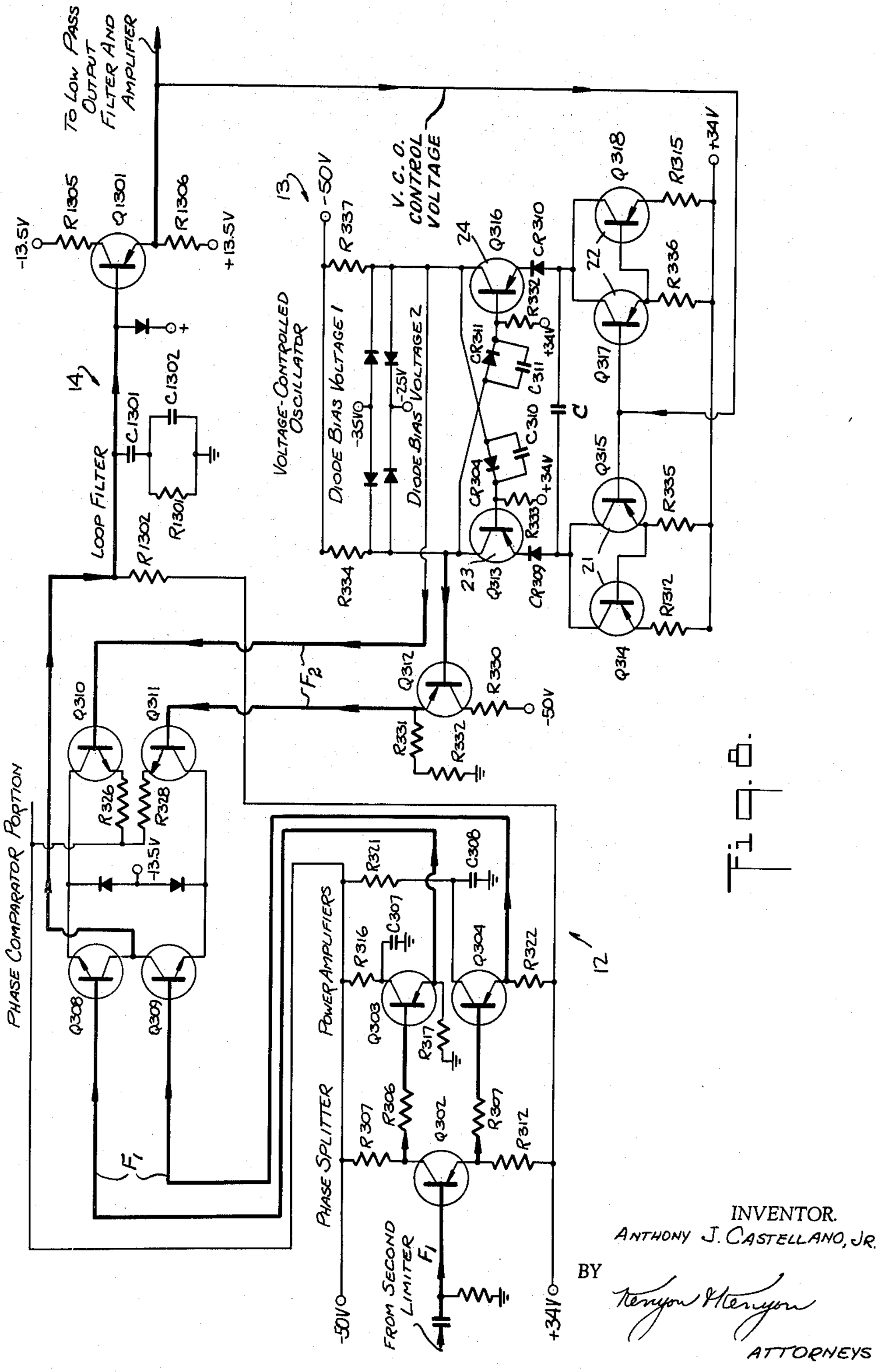

The VCO illustrated in FIG. 6 has a means for widening frequency deviation in the resistors R1313 and R1317. As the D.C. level at the input increases, the bases of the transistors Q315, Q314, Q317 and Q318 will be positively biased thereby decreasing emitter-collector current, which is desired to decrease output frequency $F_2$. The emitters will follow this positive D.C. error signal and thus the D.C. error signal will appear at the junction of R1312 and R1313. A positive signal on the Q314 emitter will divert current from the transistor Q314 through the resistor R1313 and in this fashion will increase the current change from the source 21 and thereby increase frequency deviation.

If we take the condition where the switch 23 is on, this just described decrease in current will result in decreased flow through the transistor that constitutes the switch 23. There then arises the problem of insufficiently clamping the collector of the transistor Q313 and thus of losing its ability to operate as a switch. The problem is aggravated by the peaks of the triangular wave which is also fed to the VCO input.

The triangular wave is a double frequency wave and would normally not affect the operation of the VCO, it being only the D.C. component of the triangular wave which has an effect on output frequency. However, for the short periods when the positive peaks of the triangular wave are added to a positive D.C. error signal there will be a decrease in switch 23, 24 collector current that can cause loss of the switch operation and thus failure of the VCO to operate as an oscillator.

This invention permits obtaining a wide deviation without requiring the collector current through the switches 23 and 24 to become so low in value as to create the above mentioned loss of clamp problem. The resistors R1313 and R1317 may be eliminated or if used to provide some deviation expansion may be kept at a high enough value to avoid diverting too much current from the switch 23, 24 collector. Accordingly, the double frequency triangular wave output of the loop filter 14 can be accommodated without losing lock.

It might be incidentally noted that when one of the switches, say switch 24, is turned on by the pre-determined positive voltage build up on the Q316 emitter, the Q316 collector will go positive. The positive Q316 collector swing is coupled through the capacitor C310 to the Q313 base, thereby serving to turn the switch 23 off. The Q313 collector is coupled to the Q316 base through the capacitor C311 for the analogous purpose when the switch 23 is turned on.

*The secondary current source*

Figure 7:
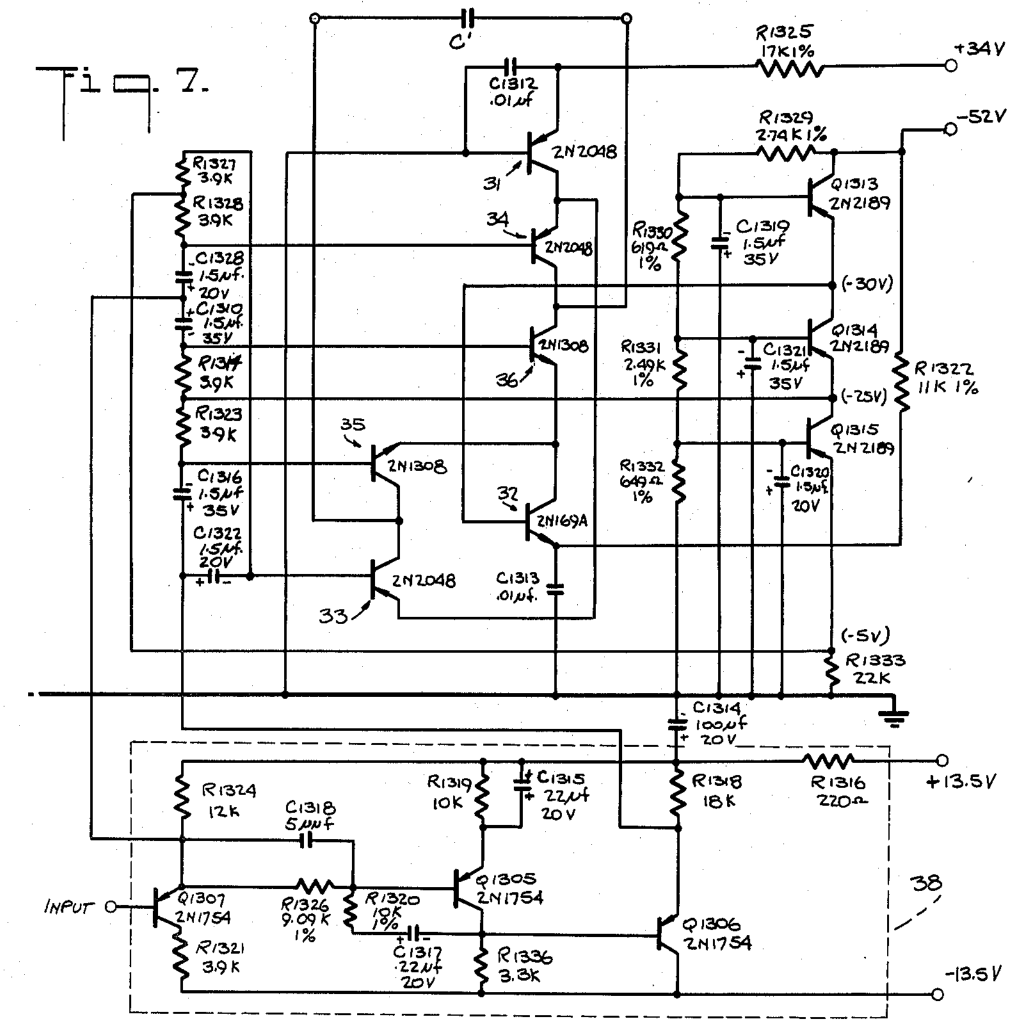
FIG. 7 is a schematic diagram of the current source of FIG. 5.

This invention is directed to the combining of a secondary current source with a VCO to provide a wide band VCO and is also directed to the incorporation of such a wide band VCO in a phase locked loop. Accordingly, there is no particular limitation to any one design of secondary current source 17. FIG. 7 is a schematic of one particular current source 17 which has been found useful with the type of phase locked loop design shown in schematic in FIG. 8.

In FIG. 7, it should be noted that the input to the current source 17 is from the collector of Q313 (the switch 23) shown in FIG. 6. In the particular embodiment shown, the Q313 collector has a 10 volt peak to peak square wave voltage. This voltage is first fed through an emitter follower and then to a ten to one voltage divider to provide a one volt peak to peak square wave in the phase splitter 38. A circuit is also provided to set a base of zero so that this square wave is plus ½ to minus ½ volt peak to peak.

Briefly, the input signal to the current source 17 of FIG. 7 is fed to an emitter follower Q1307 and directly off the emitter of Q1307 is connected to control the switches 34 and 36. The Q1307 emitter is also connected to a feedback amplifier Q1305 with a gain of one which operates as a phase inverter. The transistor Q1305 operates as a phase inverter by virtue of its inherent 180° phase shift from collector to base. The phase inverter Q1305 collector output is amplified by amplifier Q1306 and connected to control switches 33 and 35.

The series components R1327, R1328, etc. serve to provide a bias for the base electrodes of switches 34, 33, 36 and 35 and also to set a base for the square wave to vary from plus ½ volt peak to minus ½ volt peak.

The way in which the switches 33, 34, 35 and 36 control the current sources 31 and 32 have been explained in connection with FIG. 5 and are more clearly understood by reference thereto. FIG. 7 adds the details of how the controlling signal for switches 33 and 35 is made 180° out of phase with the controlling signal for switches 34 and 36.

To assure proper operation of this secondary current source 17 and particularly to hold its output to exactly the desired current (two milliamperes in this embodiment) it is necessary to accurately control certain internal voltages. The voltage divider R1329, R1330, R1331 and R1332 develops the desired voltages and the series voltage regulators Q1313, Q1314 and Q1315 regulate the voltages indicated to establish voltage accuracy and stability. The resistor R1333 is simply a bleeder resistor to maintain a minimum current through these regulators.

The current source 31 two milliamperes current is determined by the 34 volt drop across the 17K resistor R1325. The current source 32 two milliampere current is determined by a 22 volt drop across the 11K resistor R1322 (22 volt drop because there is a −52 volt potential on one side and a −30 volt potential on the other side from the emitter of the transistor Q1308). All these voltages must be accurate to maintain an accurate two milliamperes current so that there will be a constant and accurate band center frequency.

FIG. 8 is included in order to show a specific embodiment of the phase locked loop 11 with which the specific embodiment of the current source 17 may be used. There are variations in the embodiments illustrated that would be obvious to the designer skilled in this art and that would be made to accommodate variations in loop 11 design, variations in band center frequency, and variations in VCO applications.

One variation should be noted. Though the discussion has all been directed to expanding maximum deviation available, it is possible to contract deviation by reversing the output connections from the secondary current source 17 across the timing capacitor C′. The minimum deviation without this invention was limited to about 7½% and with this invention was reduced in the embodiment shown to about 4½%.

In FIG. 8, heavy lines are employed to show the main path that the signals ($F_1$, $F_2$ and error signal) take. The information signal $F_1$ is fed to the phase splitter Q302 where the inherent 180° phase shift from collector to base of the transistor Q302 provides two signals 180° out of phase with one another and otherwise substantially identical. The two signals are then fed to power amplifier transistors Q303 and Q304 respectively to provide inputs to the bases of transistors Q308 and Q309. The VCO 13 output $F_2$ is fed to the bases of transistors Q310 and Q311. The four phase comparator transistors Q308, Q309, Q310 and Q311 are interconnected in a fashion well-known in this art to provide a duty cycle modulated output from the phase comparator 12. The extent of the duty cycle modulation is a function of the difference in frequency between the signals $F_1$ and $F_2$.

In this particular embodiment, the current magnitude from the alternating current source 17 has been mentioned as two milliamperes. Other current magnitudes could be used to obtain other maximum frequency deviation limits.

It would also be possible to make the magnitude of the alternating current source 17 variable in response to the error signal. Thus current variations in the alternating current source 17 or in the main current source 21, 22 or in both at the same time could be used to control frequency deviation.

In the claims, and most of the specification, the phrase voltage controlled oscillator (VCO) refers to the prior art VCO, while the phrase modified voltage controlled oscillator refers to a VCO incorporating this invention.

What is claimed is:

1. In a relaxation oscillator having a timing capacitor, a main source of current for charging said capacitor, and a switch responsive to the voltage on said capacitor and connected to said main current source to pass the current from said main current source when said capacitor reaches a pre-determined voltage, the improvement comprising:
  a secondary current source connected across said capacitor to modify the net current flowing to said capacitor without modifying the current available to be passed by said switch, and
  control means responsive to the change of state of said switch to cause the direction of current flow from said secondary current source to said capacitor to change at the same frequency as the rate of change of state of said switch.

2. In a relaxation oscillator having a timing capacitor, a main current source connected across said capacitor, and switching means connected across said capacitor, said switching means responsive to the voltage on said capacitor to turn on when a pre-determined voltage is attained at said capacitor thereby passing current from said main current source, the improvement comprising:
  a secondary current source connected across said capacitor to buck the current to said capacitor from said main current source thereby modifying the net current flowing to said capacitor without modifying the current available to be passed by said switch, and
  control means responsive to the change of state of said switch to cause the direction of current flow from said secondary current source to said capacitor to change at the same frequency as the rate of change of state of said switch,
  whereby variations in the magnitude of current from said primary current source will cause a greater frequency deviation than if said secondary current source were not provided yet the magnitude of current available to be passed by said switch will not thereby be decreased.

3. In a relaxation oscillator having (a) a timing capacitor, (b) a first unidirectional main current source connected to a first side of said capacitor, (c) a second unidirectional main current source connected to the second side of said capacitor, (d) switching means connected across said capacitor, said switching means changing state in response to a pre-determined voltage on either side of said capacitor to pass current from the corresponding one of said main current sources when said pre-determined voltage is attained on the corresponding side of said capacitor, and (e) means controlling the state of said switching means whereby when current from one of said main current sources is being passed, current from the other one of said main current sources is blocked by said switching means thereby causing current from said other one of said main current sources to build up a voltage on the corresponding side of said capacitor, the improvement comprising:
  a secondary current source connected across said capacitor to modify the net current flowing to said capacitor without modifying the current available to be passed by said switch, and
  control means responsive to the change of state of said switching means to cause the direction of current flow from said secondary current source to said capacitor to change at the same frequency as the rate of change of stage of said switching means.

4. In a relaxation oscillator having (a) a timing capacitor, (b) a first unidirectional main current source connected to a first side of said capacitor, (c) a second unidirectional main current source connected to the second side of said capacitor, (d) switching means connected across said capacitor, said switching means changing state in response to a pre-determined voltage on either side of said capacitor to pass current from the corresponding one of said main current sources when said pre-determined voltage is attained on the corresponding side of said capacitor, and (e) means controlling the state of said switching means whereby when current from one of said main current sources is being passed, current from the other one of said main current sources is blocked by said switching means thereby causing current from said other one of said main current sources to build up a voltage on the corresponding side of said capacitor, the improvement comprising:
  a secondary current source connected across said capacitor to buck the current to said capacitor from from main current source thereby modifying the net current flowing to said capacitor without modifying the current available to be passed by said switching means, and
  control means responsive to the change of state of said switching means to cause the direction of current flow from said secondary current source to said capacitor to change at the same frequency as the rate of change of state of said switching means,
  whereby variations in the magnitude of current from said primary current source will cause a greater frequency deviation than if said secondary current source were not provided yet the magnitude of current available to be passed by said switching means will not thereby be decreased.

References Cited by the Examiner

UNITED STATES PATENTS

| | | | |
|---|---|---|---|
| 2,750,502 | 6/1956 | Gray | 331—177 |
| 2,767,378 | 10/1956 | Hass | 331—177 X |
| 2,972,120 | 2/1961 | Kircher et al. | 331—116 |
| 2,990,519 | 6/1961 | Wagner | 331—113.1 |
| 3,021,492 | 2/1962 | Kaufman | 331—36 X |
| 3,037,172 | 5/1962 | Biard | 331—113 |
| 3,048,796 | 8/1962 | Snow et al. | 331—36 X |
| 3,133,257 | 5/1964 | Palmer et al. | 331—113 |
| 3,145,349 | 8/1964 | Turrell | 331—113 |

ROY LAKE, *Primary Examiner.*

JOHN KOMINSKI, *Examiner.*

S. H. GRIMM, *Assistant Examiner.*